US008569771B2

(12) United States Patent
Tasch et al.

(10) Patent No.: US 8,569,771 B2
(45) Date of Patent: Oct. 29, 2013

(54) LED MODULE WITH AN LED SEMICONDUCTOR CHIP MOUNTED ON A SILICON PLATFORM

(75) Inventors: Stefan Tasch, Jennersdorf (AT); Nick Shepherd, Fuerstenfeld (AT)

(73) Assignee: Lexedis Lighting GmbH, Jennersdorf (AT)

( * ) Notice: Subject to any disclaimer, the term of this patent is extended or adjusted under 35 U.S.C. 154(b) by 642 days.

(21) Appl. No.: 12/527,240

(22) PCT Filed: Apr. 25, 2008
(Under 37 CFR 1.47)

(86) PCT No.: PCT/EP2008/003387
§ 371 (c)(1),
(2), (4) Date: Jul. 15, 2010

(87) PCT Pub. No.: WO2008/131939
PCT Pub. Date: Nov. 6, 2008

(65) Prior Publication Data
US 2011/0101381 A1     May 5, 2011

(30) Foreign Application Priority Data

Apr. 30, 2007  (EP) .................................. 07107236
Sep. 26, 2007  (EP) .................................. 07117245

(51) Int. Cl.
*H01L 27/15* (2006.01)
(52) U.S. Cl.
USPC .................................. 257/80; 257/E33.076
(58) Field of Classification Search
USPC .............. 257/80, 79, 98, E33.076, E33.059
See application file for complete search history.

(56) References Cited

U.S. PATENT DOCUMENTS

| 5,003,357 | A | 3/1991 | Kim et al. |
| 2005/0127485 | A1 | 6/2005 | Shei et al. |
| 2005/0276053 | A1 | 12/2005 | Nortrup et al. |
| 2006/0001055 | A1 | 1/2006 | Ueno et al. |
| 2006/0071229 | A1 | 4/2006 | Guenter |
| 2007/0064421 | A1* | 3/2007 | Baba .............................. 362/231 |
| 2007/0091608 | A1* | 4/2007 | Hauffe et al. .................. 362/267 |
| 2007/0247842 | A1* | 10/2007 | Zampini et al. ................ 362/227 |
| 2008/0006837 | A1* | 1/2008 | Park et al. ........................ 257/98 |
| 2008/0018906 | A1* | 1/2008 | Kurokawa et al. ............. 356/479 |
| 2008/0251721 | A1* | 10/2008 | Ueno .............................. 250/332 |

FOREIGN PATENT DOCUMENTS

| EP | 1587151 A2 | 10/2005 |
| JP | 11251644 A | 9/1999 |
| JP | 2001015815 | * 1/2001 |
| JP | 2001015815 A | 1/2001 |
| WO | WO-9928971 A1 | 6/1999 |
| WO | WO-2005062393 A2 | 7/2005 |

OTHER PUBLICATIONS

International Search Report for PCT/EP2008/003387 dated Aug. 28, 2008.

* cited by examiner

*Primary Examiner* — Kimberly Rizkallah
*Assistant Examiner* — Duy T Nguyen
(74) *Attorney, Agent, or Firm* — Marshall, Gerstein & Borun LLP

(57) ABSTRACT

An LED module having an LED semiconductor chip mounted directly or indirectly on a platform. The platform is made from silicon and extends laterally beyond the LED semiconductor chip having an active light emitting layer and a substrate. At least one electronic component that is part of the control circuitry for the LED semiconductor chip is integrated in the silicon platform.

17 Claims, 4 Drawing Sheets

LED MODULE WITH AN LED SEMICONDUCTOR CHIP MOUNTED ON A SILICON PLATFORM

Figure 1:
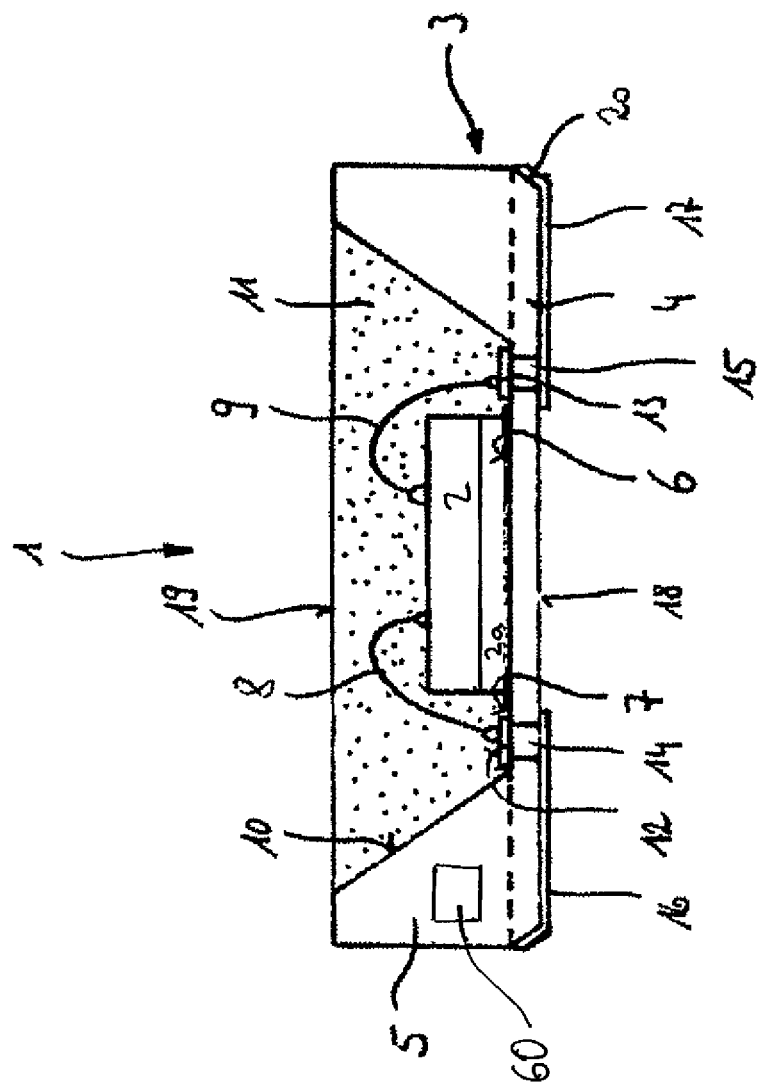

This is the US national phase of International Application PCT/EP2008/003387 filed Apr. 25, 2008, which claims priority to European Patent Application 07117245.6 filed Sep. 26, 2007, and European Patent Application 07107236.7 filed Apr. 30, 2007, the respective disclosures of which are incorporated by reference in their entireties.

The present invention relates to a LED module having a silicon platform.

US2005/2760553A US 2005/0276053 A1 discloses an LED package with a submount which may include one or more other electronic components for controlling the intensity of light emitted from the LED die.

The "submount" is an insulating board which is inserted between the chip bottom and the package ground level. Besides the insulation, the submount has other roles of facilitating thermal diffusion, harmonizing the thermal expansion coefficients between the chip and the package or adjusting the height of the chip. In the case of enhancing thermal diffusion, regulating the thermal expansion coefficients or controlling the chip height, the submount need not be an insulator. In the case of the devices stored in metallic packages, the submount is a passive, intermediate chip base which plays the role of keeping a device chip upon a package. The submount usually has the dimensions of the base of the LED chip.

Further it is known from US 2006/0001055 A1 to integrate electronic components in an LED module. The module comprises a platform with a depression formed in one side thereof. On a bottom surface of the depression there is arranged a LED chip. The platform may be made of a first silicon substrate and a second silicon substrate. The first silicon substrate forms a base part on top of which the second silicon substrate is arranged building a reflector. An integrated circuit may be arranged on the first substrate.

A "platform" according to the present description is a component which at least laterally has greater dimensions than the LED chip. The LED chip can be mounted directly on the platform or indirectly, e.g. via a submount.

It is the object of the invention to integrate further functionality in a LED module.

This object is achieved by means of the features of the independent claim. The dependent claims develop further the central idea of the present invention.

According to a first aspect the invention proposes a LED module having a LED semiconductor chip mounted directly or indirectly on a platform. The platform is made from silicon and extending laterally beyond the LED semiconductor chip having an active light emitting layer and a substrate, wherein in the silicon platform there is integrated at least one electronic component which is part of the control circuitry for the LED semiconductor chip.

The integrated electronic component can be a sensor for the light intensity, the color temperature and/or the temperature.

The integrated electronic component can be part of the LED drive electronics providing the LED semiconductor chip with power.

The integrated electronic component can be a wireless communication device.

The silicon platform can define a depression in which the LED semiconductor chip is arranged.

The walls of the silicon platform defining the depression can vertically extend beyond the active light emitting layer of the LED semiconductor chip.

The walls of the depression can be vertical, inclined or curved.

The walls of the depression can be designed as reflector walls.

The electronic component can be integrated in the walls of the silicon platform defining the depression.

The electronic component can be integrated in the base part of the silicon platform.

The depression can be at least partially filled with a color conversion medium.

Further advantages, objects and features of the present invention will become obvious to the skilled person when reading the following detailed explanation of preferred embodiments of the present invention when taken in conjunction with the figures of the enclosed drawings.

Figure 2:
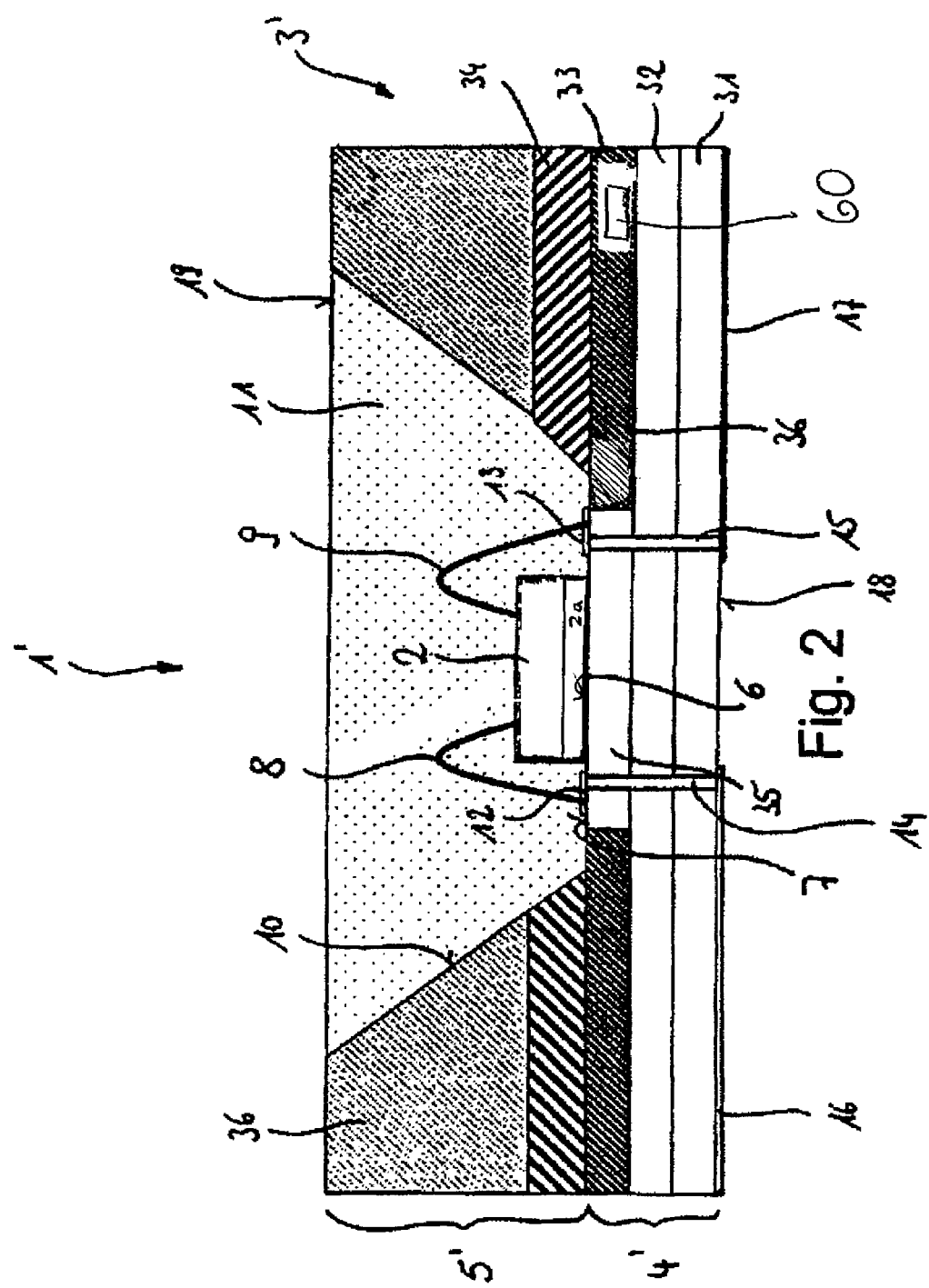
Figure 3:
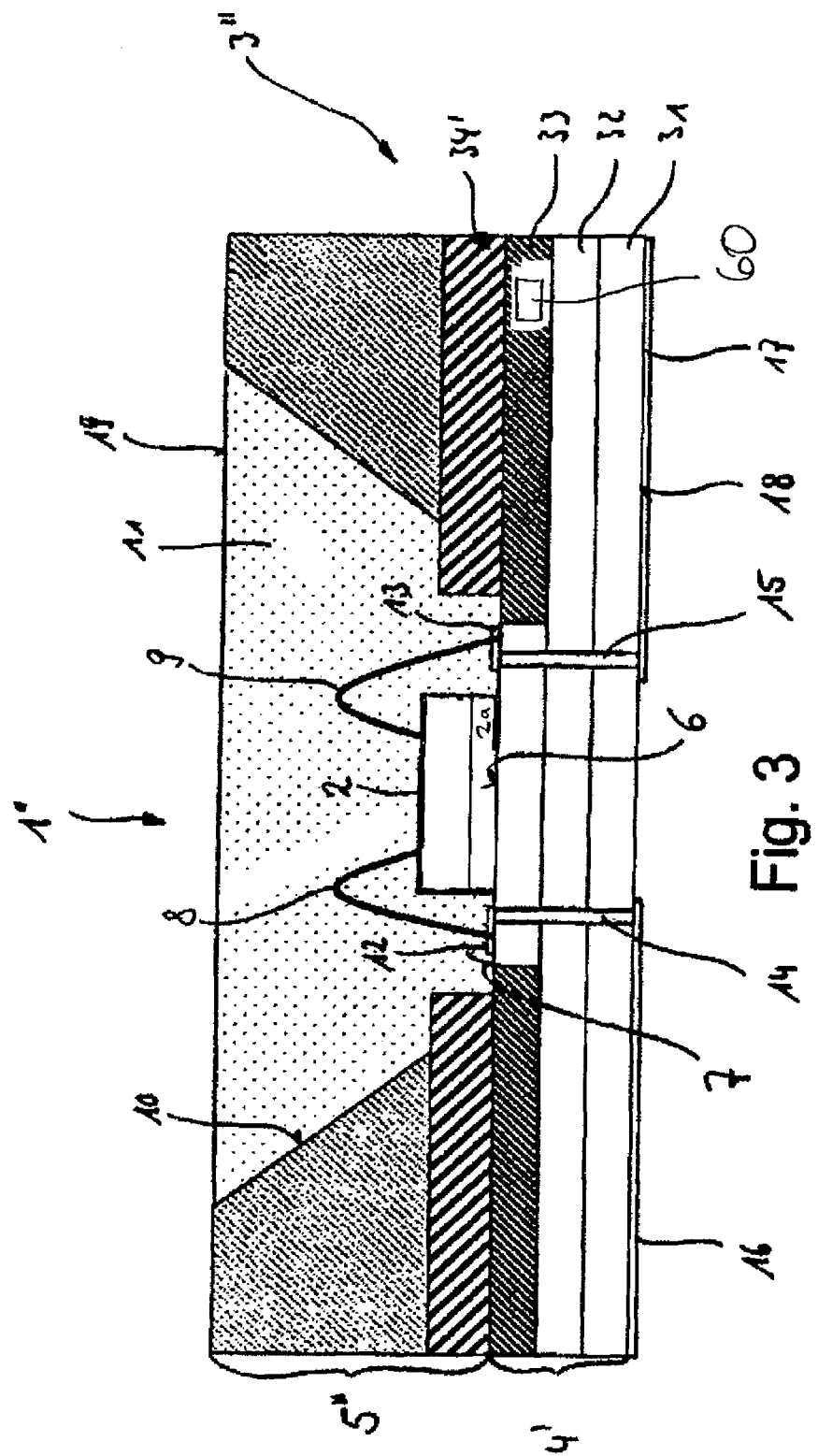
Figure 4:
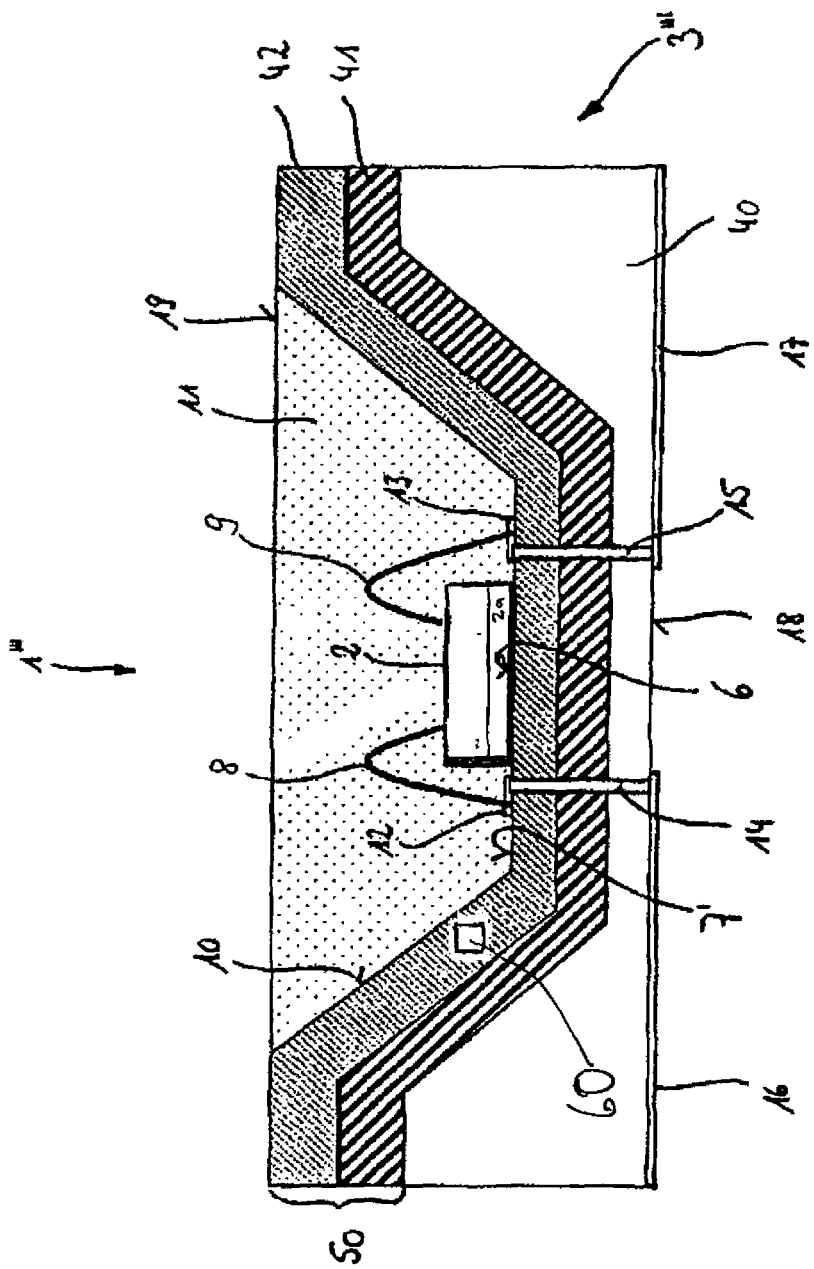

FIG. 1 shows an example of a LED module having an intelligent silicon platform, i.e. a silicon platform with integrated electronics, FIG. 2 shows a second embodiment of a LED module having an intelligent silicon platform with intermediate layers, FIG. 3 shows an alternative of a LED module of FIG. 2 with an adapted reflector and FIG. 4 shows another example of a LED module having an intelligent silicon platform with a two layer reflector.

FIG. 1 shows a LED module 1 comprising a semiconductor LED chip 2. The LED chip 2 can be mounted in face-up or face-down geometry.

The LED chip 2 has an active light emitting area and a substrate 2a as is well known in the art.

The LED chip 2 is mounted directly on a silicon platform 3 or indirectly, i.e. by means of a submount which is not shown in the illustrated embodiment. The submount has lateral dimensions that correspond basically to the dimensions of the LED chip 2. In any case, the silicon platform 3 is not comparable with submounts.

The shown silicon platform 3 extends laterally beyond the countours of the LED chip 2. It may also extend vertically beyond the LED chip 2 and particularly the active light emitting area of the LED chip 2.

The silicon platform 3 may be designed to define an open cavity or depression 10, at the bottom 7 of which the LED chip 2 is arranged.

The side walls of the depression 10 in the silicon platform 3 are constituted by the reflector and may be curved, vertical or inclined (as shown in the illustrated embodiment). They may serve as a reflector and can be metallised to this regard.

The depression 10 may be filled at least partially with a color conversion layer 11 partially converting light emitted from the LED chip 2 into light having a different (longer) wavelength). The color conversion layer 11 may comprise phosphor embedded in a silicone mould.

Thus the mix of the light from the LED chip 2 and the down-converted light can leave the exit surface 19 of the LED module 1.

According to the invention electronics 60 is integrated in the silicon platform 3. This electronics may be or more of the following components:
optical sensor,
color temperature sensor, temperature sensor,
control circuitry for the LED chip, such as e.g. a LED driver or a AC/DC converter, and/or wireless telecommunications components.

The electronics 60 integrated in the platform 3 may be an integrated circuitry.

In the illustrated embodiment platform 3 comprises a silicon substrate 4 which is a base part of platform 3. A first side of this silicon substrate 4 forms the bottom 7 of the depression 10 on which the LED chip 2 is mounted. In a lateral outer region of the silicon substrate 4 the side walls are arranged protruding from the first side of the silicon substrate 4. The height of the walls is preferably greater than the height of the LED chip 2. Thus the light emitting area of the LED chip 2 can be covered with the color conversion layer 11.

In a preferred embodiment the walls are made as a silicon reflector 5. The surface of the silicon reflector 5 which is directed to the depression 10 may be metallized in order to improve reflection. For contacting the LED chip 2 bonding wires 8, 9 are arranged and secured inside the silicon mould of the color conversion layer 11. The bonding wires 8, 9 connect the LED chip 2 with respective connecting areas 12, 13 which are arranged on the first side of silicon substrate 4 adjacent a mounting area 6 on which the LED chip 2 is mounted.

The connecting areas 12, 13 are connected to a first electrode 16 and a second electrode 17 respectively by means of contact vias 14, 15. The first electrode 16 and the second electrode 17 are arranged on a second surface 18 of the silicon substrate 4 opposed to said first side 7 of the silicon substrate 4.

The outer edges of the silicon substrate 4 are provided with a fillet area 20. In the illustrated embodiment of FIG. 1 electrodes 16, 17 follow the outer shape of the fillet area 20 of silicon substrate 4 thereby providing the LED module 1 with a contact area at the outer edge of the LED module 1.

In FIG. 1 a basic structure of a LED module 1 according to the present invention is illustrated. As it was already mentioned above the LED chip 2 can also be mounted on top of a submount which is consequently located between the LED chip 2 and the first surface 7 of the silicon substrate 4. The platform 3 comprising the silicon substrate 4 and the silicon reflector 5 may be fabricated by an edging process for example in order to generate depression 10 in which the LED chip 2 is arranged. The electronic component 60 is preferably arranged in the walls of the silicon reflector 5 or in the silicon substrate 4. When the electronic component 60 is arranged inside silicon substrate 4 it is arranged preferably nearer to the outer edge of the silicon substrate 4. The arrangement of the electronic component 60 in the outer region of the platform 3 generally improves the sensing functionality. In particular if color temperature sensing is provided the sensing elements are not shaded by the LED chip itself or even by a submount.

Another preferred embodiment is shown in FIG. 2. The platform 3' is made of a number of individual layers that are laminated to build platform 3'. A first layer 31 and a second layer 32 build the base part of platform 3' together with a first intermediate layer 32. The first intermediate layer 33 is arranged on top of this first layer 31 and second layer 32. The base part of the platform 3' corresponds to the silicon substrate 4 of the first embodiment illustrated in FIG. 1.

The first intermediate layer 33 comprises a central portion and an outer region 36. With the LED chip 2 being mounted on the central portion 35 of the first intermediate layer 33 it is preferred that the electronic component 60 is arranged in the outer region 36 of the first intermediate layer 33. On top of the first intermediate layer 33 a second intermediate layer 34 is arranged. The second intermediate layer 34 is a first part of reflector 5'. On top of the second intermediate layer 34 an upper reflector part 36 is arranged. In the illustrated embodiment it is shown that the second intermediate layer 34 together with the upper reflector part 36 comprise an inclined surface defining depression 10 of the LED module To adapt the reflecting properties of the reflector 5' it is possible to metallise either the upper reflector 36 or the second intermediate layer 34, both or none.

In an alternative embodiment it is also possible to arrange the electronic components 60 in the second intermediate layer 34 instead of the first intermediate layer 33.

In general the arrangement of the electronic components 60 in the platform 3 or 3' either in the silicon substrate or in the reflector has the advantage that different functions as light sensing or light color sensing for example is improved. The sensing elements may be arranged besides the LED chip 2. Thereby light which is emitted by the LED chip 2 can be sensed by the electronic components 60 in the silicon substrate 4 or the silicon reflector 5 without being shaded by the LED chip 2 or a submount 2a. Although there is a direct contact to the depression area of the LED module 1 no additional space on the bottom surface of depression 10 is needed in order to arrange the electronic components 60 adjacent to the LED chip 2.

The further illustrated embodiment of a LED module 1" of FIG. 3 corresponds basically to that of FIG. 2. Contrary to the embodiment of FIG. 2 the inner edges of the second intermediate layer 34' are provided with a rectangular edge. By shaping the inner edge of for example the second intermediate layer 34' as well as the surface of the wall of the reflector 5 and the upper part of the reflector 36 the resulting surface of the depression 10 is adapted to desired reflection characteristics.

In FIG. 4 there is shown a third embodiment. Contrary to FIGS. 2 and 3 it is shown that the platform 3''' is made of three consecutive layers. A first layer forms the base part 40. Its shape defines the shape of depression 10. On top of the base part there is arranged a first additional layer 41 and a second additional layer 42. The shape of the first and the second additional layer 41, 42 correspond basically to the shape of the base part 40. The LED chip 2 is mounted on the second additional layer 42. Following the shape of the base part 40 the second additional layer 42 comprises a bottom surface 7' of the depression 10. The additional layers establish the reflector 50.

As it can be seen in the illustrated embodiments it is preferred to arrange the electronic component 60 not under the LED chip 2 but adjacent to the LED chip 2. It is in particular preferred to locate the LED chip in a wall of the reflector. The reflector can be constituted from a number of consecutive layers.

In particular when the electronic component 60 comprises means for controlling the color temperature it is preferred to arrange the electronic component 60 near the LED chip 2. Thereby it is preferred to arrange the electronic component 60 inside either the first additional layer or the second additional layer. Platform 3 may comprise further layers.

The invention is not limited to the illustrated embodiment but comprises also advantageous combinations of features of different embodiments.

The invention claimed is:

1. An LED module, comprising:
an LED semiconductor chip mounted directly or indirectly on a platform, the platform being made from silicon and extending laterally beyond the LED semiconductor chip, wherein:
the LED semiconductor chip comprises an active light emitting layer and a substrate,
the silicon platform includes a base part and a reflector and the reflector comprises at least one intermediate layer,
at least one electronic component that is part of a control circuitry for the LED semiconductor chip integrated in said intermediate layer,
walls of the silicon platform define a depression and extend vertically beyond the active light emitting layer of the LED semiconductor chip, the integrated electronic component is at least one of a wireless communication device and a sensor for at least one of light intensity, color temperature, and temperature, and the LED chip is mounted on a bottom surface of said intermediate layer.

2. The LED module according to claim 1, wherein the integrated electronic component is part of LED drive electronics providing the LED semiconductor chip with power.

3. The LED module according to claim 1, wherein the silicon platform defines the depression in which the LED semiconductor chip is arranged.

4. The LED module according to claim 3, wherein the depression defines walls that are vertical, inclined, or curved.

5. The LED module according to claim 4, wherein the depression defines reflector walls.

6. The LED module according to claim 3, wherein the depression defines reflector walls.

7. The LED module according to claim 3, wherein the electronic component is integrated in a wall of the silicon platform defining the depression.

8. The LED module according to claim 1, wherein the depression is at least partially filled with a color conversion medium.

9. An LED module, comprising:

an LED semiconductor chip mounted directly or indirectly on a platform, the platform being made from silicon and extending laterally beyond the LED semiconductor chip, wherein:

the LED semiconductor chip comprises an active light emitting layer and a substrate, the silicon platform comprises a base part and a reflector and the base part comprises at least a lower layer and an upper layer, at least one electronic component that is part of a control circuitry for the LED semiconductor chip integrated in said lower layer, walls of the silicon platform define a depression and extend vertically beyond the active light emitting layer of the LED semiconductor chip, and the integrated electronic component is at least one of a wireless communication device and a sensor for at least one of light intensity, color temperature, and temperature.

10. The LED module according to claim 9, wherein the integrated electronic component is part of LED drive electronics providing the LED semiconductor chip with power.

11. The LED module according to claim 9, wherein the silicon platform defines the depression in which the LED semiconductor chip is arranged.

12. The LED module according to claim 11, wherein the depression defines walls that are vertical, inclined, or curved.

13. The LED module according to claim 12, wherein the depression defines reflector walls.

14. The LED module according to claim 11, wherein the depression defines reflector walls.

15. The LED module according to claim 9, wherein the base part of the silicon platform arranged below the LED chip comprises said lower layer in which the electronic component is integrated.

16. The LED module according to claim 9, wherein the depression is at least partially filled with a color conversion medium.

17. The LED module according to claim 9, wherein the electronic component is arranged in an outer region of the lower layer.

* * * * *